(12) United States Patent
Carapelli et al.

(10) Patent No.: US 10,266,387 B2
(45) Date of Patent: Apr. 23, 2019

(54) FUEL DISPENSER SENSOR ASSEMBLY

(71) Applicant: Gilbarco Inc., Greensboro, NC (US)

(72) Inventors: Giovanni Carapelli, High Point, NC (US); Michael Charles Liebal, Greensboro, NC (US); Wayne McNinch, Greensboro, NC (US); Howard Myers, Greensboro, NC (US); Edward A. Payne, Kernersville, NC (US); Christopher Adam Oldham, High Point, NC (US)

(73) Assignee: Gilbarco Inc., Greensboro, NC (US)

( * ) Notice: Subject to any disclaimer, the term of this patent is extended or adjusted under 35 U.S.C. 154(b) by 22 days.

(21) Appl. No.: 15/477,813

(22) Filed: Apr. 3, 2017

(65) Prior Publication Data

US 2017/0283239 A1    Oct. 5, 2017

Related U.S. Application Data

(60) Provisional application No. 62/316,634, filed on Apr. 1, 2016.

(51) Int. Cl.
| | |
|---|---|
| *B64G 1/56* | (2006.01) |
| *B67D 7/08* | (2010.01) |
| *B67D 7/04* | (2010.01) |
| *G07F 13/02* | (2006.01) |
| *G01R 31/08* | (2006.01) |
| *G01F 1/68* | (2006.01) |
| *G01M 9/06* | (2006.01) |

(Continued)

(52) U.S. Cl.
CPC .......... *B67D 7/08* (2013.01); *B67D 7/04* (2013.01); *B64G 1/56* (2013.01); *B67D 7/0486* (2013.01); *B67D 7/16* (2013.01); *B67D 7/36* (2013.01); *B67D 7/76* (2013.01); *G01F 1/68* (2013.01); *G01L 19/0007* (2013.01); *G01M 9/065* (2013.01); *G01R 31/08* (2013.01); *G07F 13/025* (2013.01)

(58) Field of Classification Search
CPC ........................................................ B64G 1/56
USPC ........................................................ 73/432.1
See application file for complete search history.

(56) References Cited

U.S. PATENT DOCUMENTS

| | | | |
|---|---|---|---|
| 5,040,577 A | * | 8/1991 | Pope .................... B67D 7/0486 141/45 |
| 5,871,651 A | | 2/1999 | McSpadden |

(Continued)

OTHER PUBLICATIONS

International Search Report PCT/US/2017/025759, dated Jul. 8, 2017, 4 pgs.*

(Continued)

*Primary Examiner* — Clayton E Laballe
*Assistant Examiner* — Kevin Butler
(74) *Attorney, Agent, or Firm* — Nelson Mullins Riley & Scarborough, LLP

(57) ABSTRACT

A fuel dispenser comprising fuel flow piping defining a flow path from a source of fuel toward a fueling nozzle. The fuel flow piping further has a filter manifold for mounting a fuel filter thereon. A plurality of fuel handling components are disposed along the fuel flow piping. A sensor device is mounted to the filter manifold, the sensor device having at least one sensor operative to detect a sensed condition related to the fuel dispenser. The sensor device further comprises electronics to transmit a signal related to the sensed condition.

25 Claims, 10 Drawing Sheets

(51) Int. Cl.
  *G01L 19/00* (2006.01)
  *B67D 7/16* (2010.01)
  *B67D 7/36* (2010.01)
  *B67D 7/76* (2010.01)

(56) References Cited

U.S. PATENT DOCUMENTS

| | | | | |
|---|---|---|---|---|
| 5,954,080 A * | 9/1999 | Leatherman | ........... | F16K 31/402 |
| | | | | 137/14 |
| 6,435,204 B2 * | 8/2002 | White | ........... | B67D 7/04 |
| | | | | 137/234.6 |
| 6,441,793 B1 * | 8/2002 | Shea | ........... | H01Q 13/065 |
| | | | | 343/753 |
| 8,291,928 B2 * | 10/2012 | Reid | ........... | B67D 7/3209 |
| | | | | 137/312 |
| 2004/0217045 A1 * | 11/2004 | Gruca | ........... | B01D 35/153 |
| | | | | 210/235 |
| 2005/0228609 A1 * | 10/2005 | Moscaritolo | ........... | B01D 29/603 |
| | | | | 702/127 |
| 2010/0017041 A1 * | 1/2010 | Bentivoglio | ........... | B67D 7/32 |
| | | | | 700/283 |
| 2010/0258090 A1 | 10/2010 | Cushing | | |
| 2014/0202580 A1 * | 7/2014 | Hutchinson | ........... | B67D 7/342 |
| | | | | 141/1 |
| 2015/0346163 A1 * | 12/2015 | Garrett | ........... | G01M 3/24 |
| | | | | 73/579 |
| 2016/0047507 A1 | 2/2016 | Young | | |

OTHER PUBLICATIONS

Written Opinion International Search Report PCT/US/2017/025759, dated Jul. 8, 2017, 6 pgs.*
International Search Report and Written Opinion dated Aug. 7, 2017 in co-pending PCT application serial No. PCT/US2017/025759, all enclosed pages cited.
Invitation to Pay Additional Fees mailed on Jun. 8, 2017 in co-pending PCT application serial No. PCT/US2017/025759, all enclosed pages cited.

* cited by examiner

FUEL
FLOW

① BUTTERFLY VALVE (OPEN)
② SPRING
③ LOW-POWER SOLENOID
④ PLUNGER TO LOCK VALVE CLOSED
⑤ BUTTERFLY VALVE (CLOSED)

FUEL DISPENSER SENSOR ASSEMBLY

PRIORITY CLAIM

This application is based upon and claims the benefit of U.S. provisional application Ser. No. 62/316,634, filed Apr. 1, 2016, which is incorporated herein by reference in its entirety for all purposes.

BACKGROUND

The present invention relates generally to equipment used in fuel dispensing environments. More specifically, embodiments of the present invention relate to monitoring the health and/or status of fuel dispensing equipment.

A typical fuel dispensing environment, such as the forecourt of a retail fuel dispensing station, comprises a large number of components both for fuel handling and for conducting fuel dispensing transactions. Examples of such components include fuel dispensers, fuel piping, underground storage tanks, submersible turbine and self-contained pumps, motors, and dispensing nozzles. Further, fuel dispensers themselves typically contain flow meters, pulsers, control electronics, valves, card readers, manifolds, and internal fuel and vapor recovery piping, among many others. Many of these components are subject to regulatory requirements to maintain a high degree of accuracy and safety and to guard against environmental impact.

As is well known, for a variety of reasons, these components require periodic maintenance or replacement. Some of these components tend to wear over time, which can cause a loss of accuracy or efficiency in a fueling transaction or other operational issues. Component wear can be caused by manufacturing defects, poor fuel quality, or excessive use, among other causes. Eventually, the components may fail leading to downtime while the components are replaced. Further, some of the components may fail to operate properly, leading to customer frustration or the inability to complete a fueling transaction. Moreover, it will be appreciated that there is the potential for fraud with respect to some of these components, such as a fuel flow meter, pulser, and the control electronics.

SUMMARY

The present invention recognizes and addresses various considerations of prior art constructions and methods. According to one aspect, the present invention provides a fuel dispenser comprising fuel flow piping defining a flow path from a source of fuel toward a fueling nozzle. The fuel flow piping further has a filter manifold for mounting a fuel filter thereon. A plurality of fuel handling components are disposed along the fuel flow piping. A sensor device is mounted to the filter manifold, the sensor device having at least one sensor operative to detect a sensed condition related to the fuel dispenser. The sensor device further comprises electronics to transmit a signal related to the sensed condition. For example, the at least one sensor may comprise a plurality of different sensors including at least two of a vibration sensor, an acoustic sensor, an ionic sensor, and a temperature sensor.

In some exemplary embodiments, the sensor device has a body defining inlet and outlet flow passages therethrough. The body in this case may further define a threaded hole for attachment to a first filter mount of the manifold and a second filter mount for attachment of the filter thereto.

In some exemplary embodiments, the electronics are operative to transmit the signal wirelessly via an associated antenna. The antenna may be covered by an antenna lens.

The at least one sensor may include one or more pressure sensors operative to detect differential pressure between inflow and outflow of the filter manifold. For example, the one or more pressure sensors may comprises a microelectromechanical system (MEMS) differential pressure sensor positioned to be in fluid communication on a first side thereof with a fuel filter inlet and on a second side thereof with a fluid filter outlet.

Embodiments are also contemplated in which the sensor device comprises a power generator to produce power for its operation. For example, the power generator may comprise a turbine power generator that creates electrical energy during fuel flow. One or more energy storage components such as at least one capacitor and/or at least one battery may also be provided.

A further aspect of the present invention provides a multi-mode hydraulic sensor device for use in a fuel dispenser. The sensor device comprises a body mountable along a fuel flow path in the fuel dispenser. A plurality of different sensors are operative to detect a sensed condition related to the fuel dispenser. The sensor device further comprises electronics to transmit a signal related to the sensed condition, the electronics including a radio to transmit the signal wirelessly via an associated antenna.

Those skilled in the art will appreciate the scope of the present invention and realize additional aspects thereof after reading the following detailed description of preferred embodiments in association with the accompanying drawing figures.

BRIEF DESCRIPTION OF THE DRAWINGS

A full and enabling disclosure of the present invention, including the best mode thereof directed to one skilled in the art, is set forth in the specification, which makes reference to the appended drawings, in which.

Figure 1:
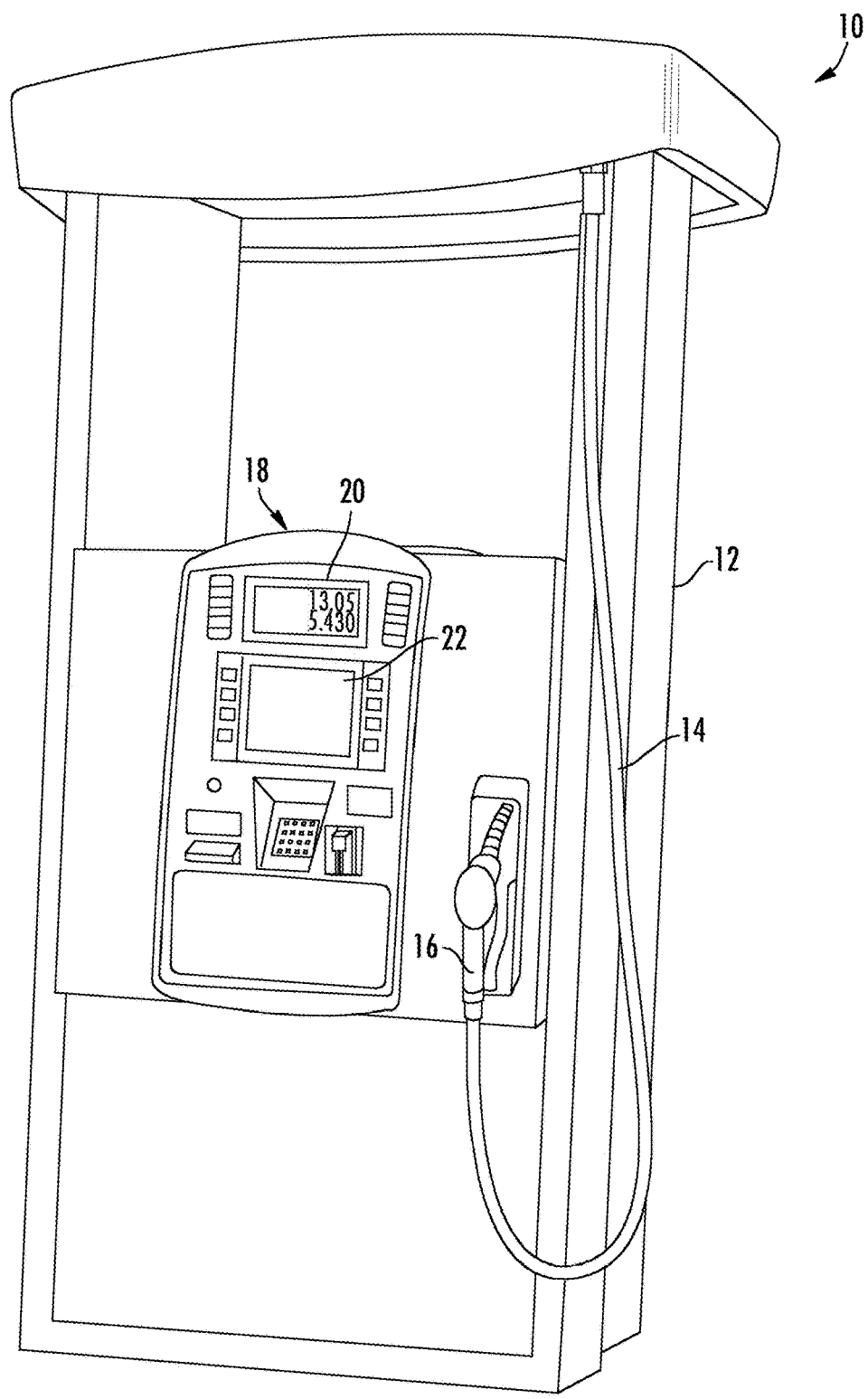
FIG. 1 is a perspective view of an exemplary fuel dispenser in accordance with an embodiment of the present invention.

Repeat use of reference characters in the present specification and drawings is intended to represent same or analogous features or elements of the invention.

DETAILED DESCRIPTION OF PREFERRED EMBODIMENTS

Reference will now be made in detail to presently preferred embodiments of the invention, one or more examples of which are illustrated in the accompanying drawings. Each example is provided by way of explanation of the invention, not limitation of the invention. In fact, it will be apparent to those skilled in the art that modifications and variations can be made in the present invention without departing from the scope or spirit thereof. For instance, features illustrated or described as part of one embodiment may be used on another embodiment to yield a still further embodiment. Thus, it is intended that the present invention covers such modifications and variations as come within the scope of the present disclosure including the appended claims and their equivalents.

Some embodiments of the present invention may be particularly suitable for use with a fuel dispenser in a retail service station environment, and the below discussion will describe some preferred embodiments in that context. However, those of skill in the art will understand that the present invention is not so limited. In fact, it is contemplated that embodiments of the present invention may be used with any fluid dispensing environment and with other fluid dispensers. For example, embodiments of the present invention may also be used with diesel exhaust fluid (DEF) dispensers, compressed natural gas (CNG) dispensers, and liquefied petroleum gas (LPG) and liquid natural gas (LNG) applications, among others.

FIG. 1 is a perspective view of an exemplary fuel dispenser 10 according to an embodiment of the present invention. Fuel dispenser 10 includes a housing 12 with a flexible fuel hose 14 extending therefrom. Fuel hose 14 terminates in a manually-operated nozzle 16 adapted to be inserted into a fill neck of a vehicle's fuel tank. Nozzle 16 includes a fuel valve. Various fuel handling components, such as valves and meters, are also located inside of housing 12. These fuel handling components allow fuel to be received from underground piping and delivered through hose 14 and nozzle 16 to a vehicle's tank, as is well understood.

Fuel dispenser 10 has a customer interface 18. Customer interface 18 may include an information display 20 relating to an ongoing fueling transaction that includes the amount of fuel dispensed and the price of the dispensed fuel. Further, customer interface 18 may include a display 22 that provides instructions to the customer regarding the fueling transaction. Display 22 may also provide advertising, merchandising, and multimedia presentations to a customer, and may allow the customer to purchase goods and services other than fuel at the dispenser.

Figure 2:
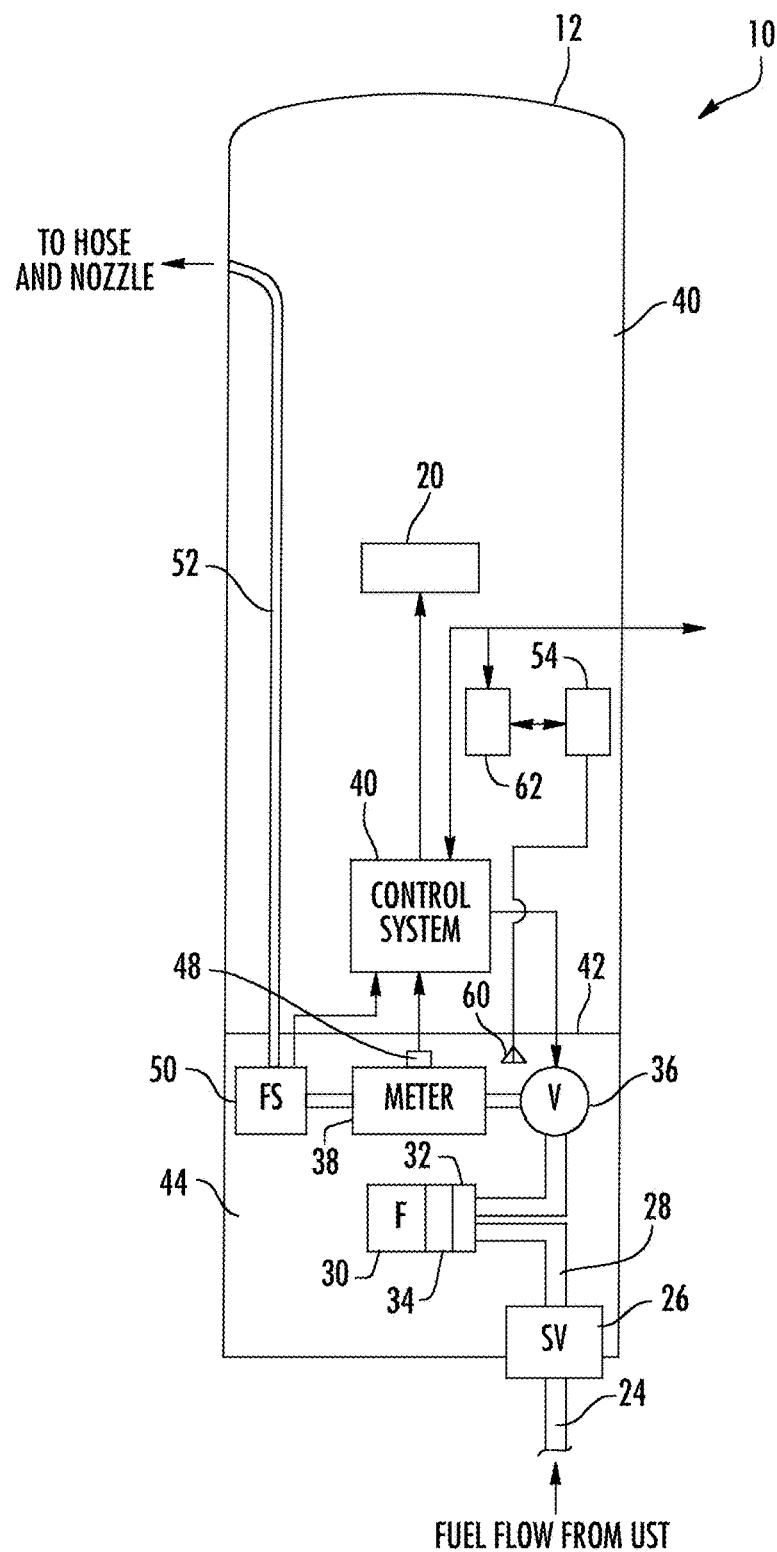
FIG. 2 is a diagrammatic representation of internal components of the fuel dispenser of FIG. 1 according to an embodiment of the present invention.

FIG. 2 is a schematic illustration of internal fuel flow components of fuel dispenser 10 according to an embodiment of the present invention. In general, fuel may travel from an underground storage tank (UST) via main fuel piping 24, which may be a double-walled pipe having secondary containment as is well known, to fuel dispenser 10 and nozzle 16 for delivery. An exemplary underground fuel delivery system is illustrated in U.S. Pat. No. 6,435,204, hereby incorporated by reference in its entirety for all purposes. More specifically, a submersible turbine pump (STP) associated with the UST is used to pump fuel to the fuel dispenser 10. However, some fuel dispensers may be self-contained, meaning fuel is drawn to the fuel dispenser 10 by a pump unit positioned within housing 12.

Main fuel piping 24 passes into housing 12 through a shear valve 26. As is well known, shear valve 26 is designed to close the fuel flow path in the event of an impact to fuel dispenser 10. U.S. Pat. No. 8,291,928, hereby incorporated by reference in its entirety for all purposes, discloses an exemplary secondarily-contained shear valve adapted for use in service station environments. Shear valve 26 contains an internal fuel flow path to carry fuel from main fuel piping 24 to internal fuel piping 28.

After fuel exits the outlet of shear valve 26 and enters into internal fuel piping 28, it may encounter a replaceable fuel filter 30 mounted via a filter manifold 32. As one skilled in the art will appreciate, fuel filter 30 functions to remove debris entrained in the flowing fuel before it reaches other fluid handling components in the fuel dispenser. Fuel filter 30 may also be designed to remove some water that may be present in the fuel. In this case, a multi-mode hydraulic sensor (MHS) 34 is positioned between filter 30 and manifold 32. MHS 34 advantageously uses the filter mount of manifold 32 as a convenient and effective manner of locating MHS 34 along the fuel flow path.

After fuel passes through filter 30, it flows toward a flow control valve 36 positioned upstream of a flow meter 38. Alternatively, valve 36 may be positioned downstream of the flow meter 38. In one embodiment, valve 36 may be a proportional solenoid controlled valve, such as described in U.S. Pat. No. 5,954,080, hereby incorporated by reference in its entirety for all purposes.

Flow control valve 36 is under control of a control system 40. In this manner, control system 40 can control the opening and closing of flow control valve 36 to either allow fuel to flow or not flow through meter 38 and on to the hose 14 and nozzle 16. Control system 40 may be any suitable electronics with associated memory and software programs running thereon whether referred to as a processor, microprocessor, controller, microcontroller, or the like. In a preferred embodiment, control system 40 may be comparable to the microprocessor-based control systems used in CRIND type units sold by Gilbarco Inc. Control system 40 typically controls other aspects of fuel dispenser 10, such as valves, displays, and the like as is well understood. For example, control system 40 typically instructs flow control valve 36 to open when a fueling transaction is authorized. In addition, control system 40 may be in electronic communication with a point-of sale system (site controller) located at the fueling site. The site controller communicates with control system 40 to control authorization of fueling transactions and other conventional activities. The memory of control system 40 may be any suitable memory or computer-readable medium as long as it is capable of being accessed by the control system.

A vapor barrier 42 delimits hydraulics compartment 44 of fuel dispenser 10, and control system 40 is located in electronics compartment 46 above vapor barrier 42. Fluid handling components, such as flow meter 38, are located in hydraulics compartment 44. In this regard, flow meter 38 may be any suitable flow meter known to those of skill in the art, including positive displacement, inferential, and Coriolis mass flow meters, among others. Meter 38 typically comprises electronics 48 that communicates information representative of the flow rate or volume to control system 40. For example, electronics 48 may typically include a pulser as known to those skilled in the art. In this manner, control system 40 can update the total gallons (or liters) dispensed and the price of the fuel dispensed on information display 20.

As fuel leaves flow meter 38 it enters a flow switch 50, which preferably comprises a one-way check valve that prevents rearward flow through fuel dispenser 10. Flow switch 50 provides a flow switch communication signal to control system 40 when fuel is flowing through flow meter 38. The flow switch communication signal indicates to control system 40 that fuel is actually flowing in the fuel delivery path and that subsequent signals from flow meter 38 are due to actual fuel flow. Fuel from flow switch 50 exits through internal fuel piping 52 to fuel hose 14 and nozzle 16 for delivery to the customer's vehicle.

A blend manifold may also be provided downstream of flow switch 50. The blend manifold receives fuels of varying octane levels from the various USTs and ensures that fuel of the octane level selected by the customer is delivered. In addition, fuel dispenser 10 may comprises a vapor recovery system to recover fuel vapors through nozzle 16 and hose 14 to return to the UST. An example of a vapor recovery assist equipped fuel dispenser is disclosed in U.S. Pat. No. 5,040,577, incorporated by reference herein in its entirety for all purposes.

In accordance with embodiments of the present invention, fuel dispenser 10 may be equipped with a plurality of sensors which monitor the health and/or status of various components in the dispenser. For example, one or more sensors may be utilized to provide "open door" fraud detection and prevention, as well as hydraulic component performance and failure monitoring (including indications of impending failure). As an "open door" system, embodiments of the present invention preferably remain functional to mitigate fraud even if panels of the dispenser housing are removed and components of the dispenser have been subjected to physical tampering (such as wires cut). Detection and monitoring may occur remotely, such as via an Internet cloud-based service.

Figure 3:
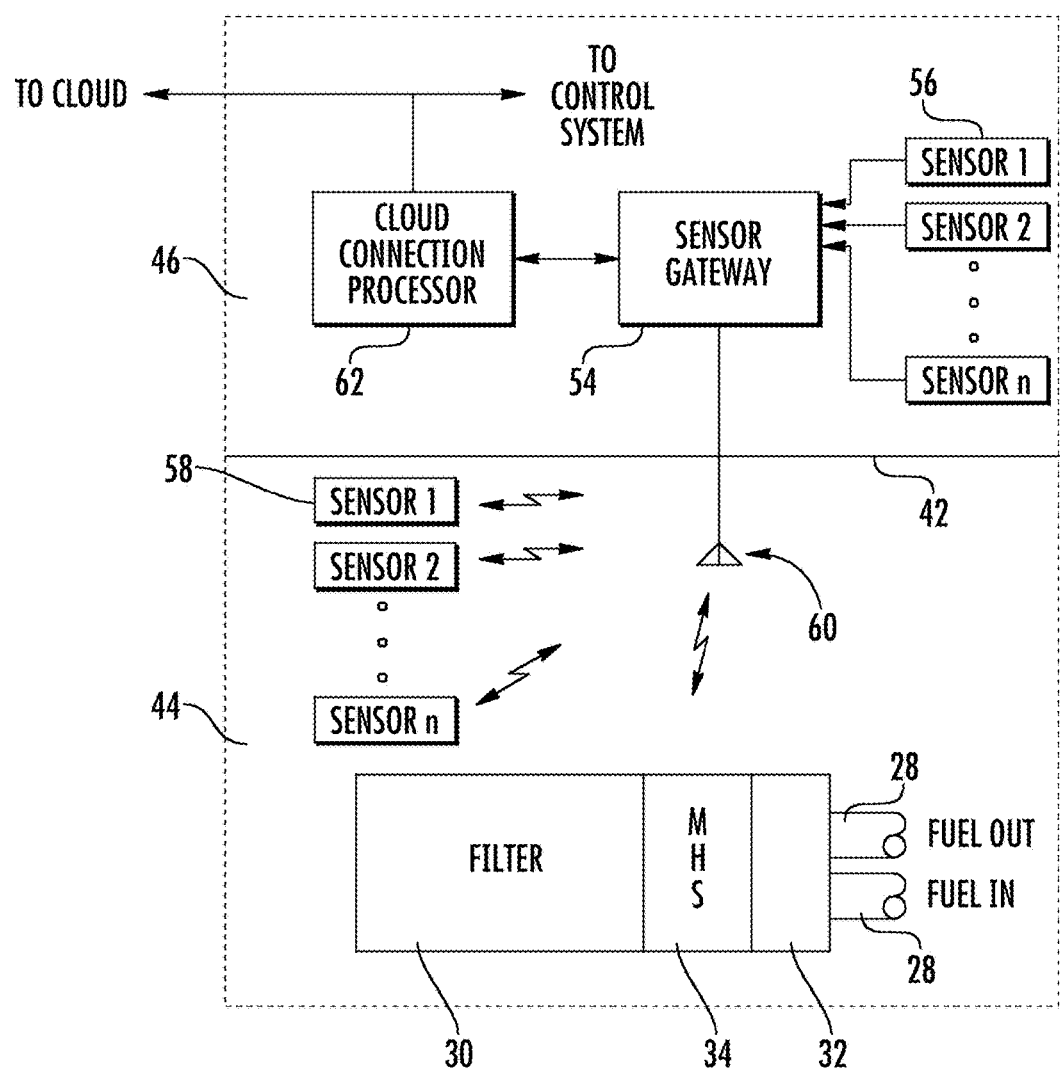
FIG. 3 is a diagrammatic representation of certain components that may be used in a sensor arrangement according to an embodiment of the present invention.

Referring now particularly to FIG. 3, certain additional aspects can be explained in greater detail. As shown, a sensor gateway 54 in this case communicates with a plurality of sensors located in both the hydraulics compartment 44 and the electronics compartment 46. The sensors may be wired sensors (e.g., sensor 56) or wireless sensors (e.g., sensor 58) as necessary or desirable. Preferably, however, sensors located in hydraulics compartment 44 may be wireless to reduce the number of wires that need to be passed through vapor barrier 42. For example, a single pickup antenna 60 can be passed through vapor barrier 42 to communicate with all sensors in the hydraulics compartment. Because, as explained below, MHS 34 preferably has several different sensors incorporated into one unit, some or all of the other discrete sensors shown in FIG. 3 may often be unnecessary.

As noted above, some preferred embodiments of the present invention utilize a MHS 34 mounted between filter 30 and manifold 32. This single device presents a nondescript profile and provides the ability to communicate securely to control system 40, as well as to remote command and control centers via Internet cloud connectivity. In this regard, sensor gateway 54 functionally interposes the various sensors and a cloud connection processor 62. Cloud connection processor 62, in turn, communicates with control system 40 and a remote cloud server (either directly or via a router located in the convenience store). Embodiments are also contemplated in which one or more of the sensors are able to communicate securely to the cloud without the need of cloud connection processor 62.

Figure 4:
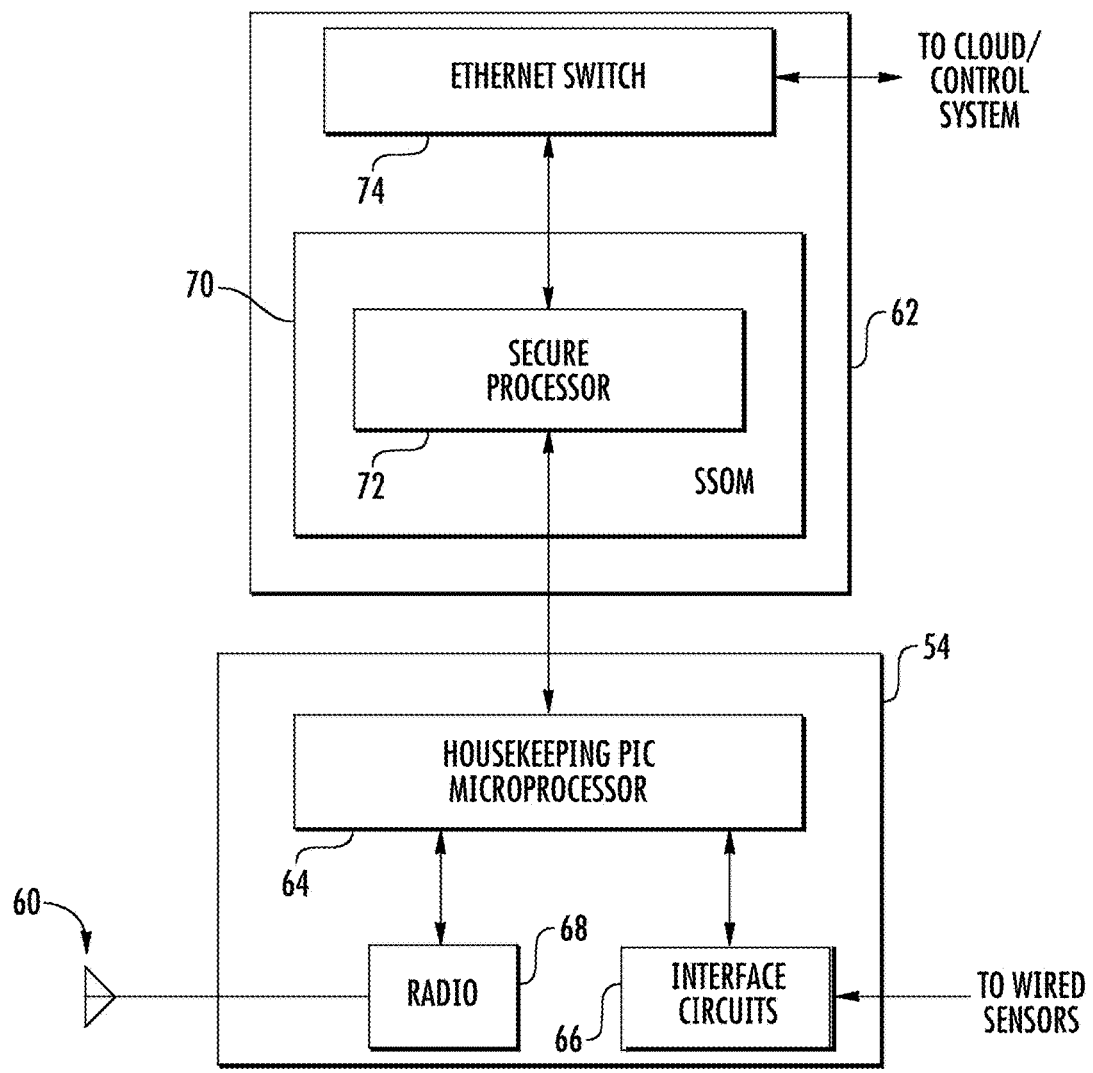
FIG. 4 is a diagrammatic representation showing additional detail of an exemplary cloud connection processor and sensor gateway according to an embodiment of the present invention.

FIG. 4 illustrates preferred components of sensor gateway 54 and cloud connection processor 62 in accordance with an embodiment of the present invention. As shown, sensor gateway 54 preferably has a microprocessor 64 for data relay, housekeeping functions, and optionally some initial processing of sensor data. In this regard, for example, microprocessor 64 may comprise a suitable peripheral interface controller (PIC). In this case, sensor gateway 54 further includes one or more interface circuits 66 for communication with any wired sensors, as well as a radio 68 that communicates with the wireless sensors (e.g., MHS 34) via antenna 60.

Cloud connection processor 62 preferably has a secure system-on-module (SSOM) 70 that provides some processing of sensor data as well as access to control system 40 and the cloud server. In this regard, SSOM 70 includes a secure processor 72, such as those available from Maxim Integrated of San Jose, Calif. Secure processor 72 contains cryptographic keys to decipher incoming information (from sensors and the cloud), and to encrypt outgoing communications when necessary. Preferably, secure processor 72 is tamper resistant such that tampering attempts will cause erasure of the data it contains. Communication between microprocessor 64 and secure processor 72 may be via serial peripheral interface (SPI). In addition, cloud connection processor 62 may include an Ethernet switch 74 to handle the incoming and outgoing flow of data. It is expected that, in most embodiments, the cloud server will provide the most powerful processing and analysis of sensor data.

One skilled in the art will appreciate that the use of a gateway device is optional depending on the embodiment. For example, the MHS may be able to communicate to the cloud directly without a gateway to interpret or aggregate for it. Regardless of using a gateway or self-contained model, embodiments are contemplated that use wireless transmission to send out events to the cloud or the gateway or a controlling system. In a system where the MHS communicates directly to the cloud, the cloud may process the data and send control messages from the cloud to the dispenser to stop a transaction or prevent transactions. Embodiments are also contemplated in which the MHS is not cloud-connected, but is connected directly to a controlling device (e.g., control system 40) and the dispenser can send messages to the cloud as a gateway as well as act on the events directly. Various modes of wireless and wired communication are contemplated, including Zigbee, wifi, Bluetooth, RS485, RS422, RS232, CAN, LON, PWM, etc.

Figure 5:
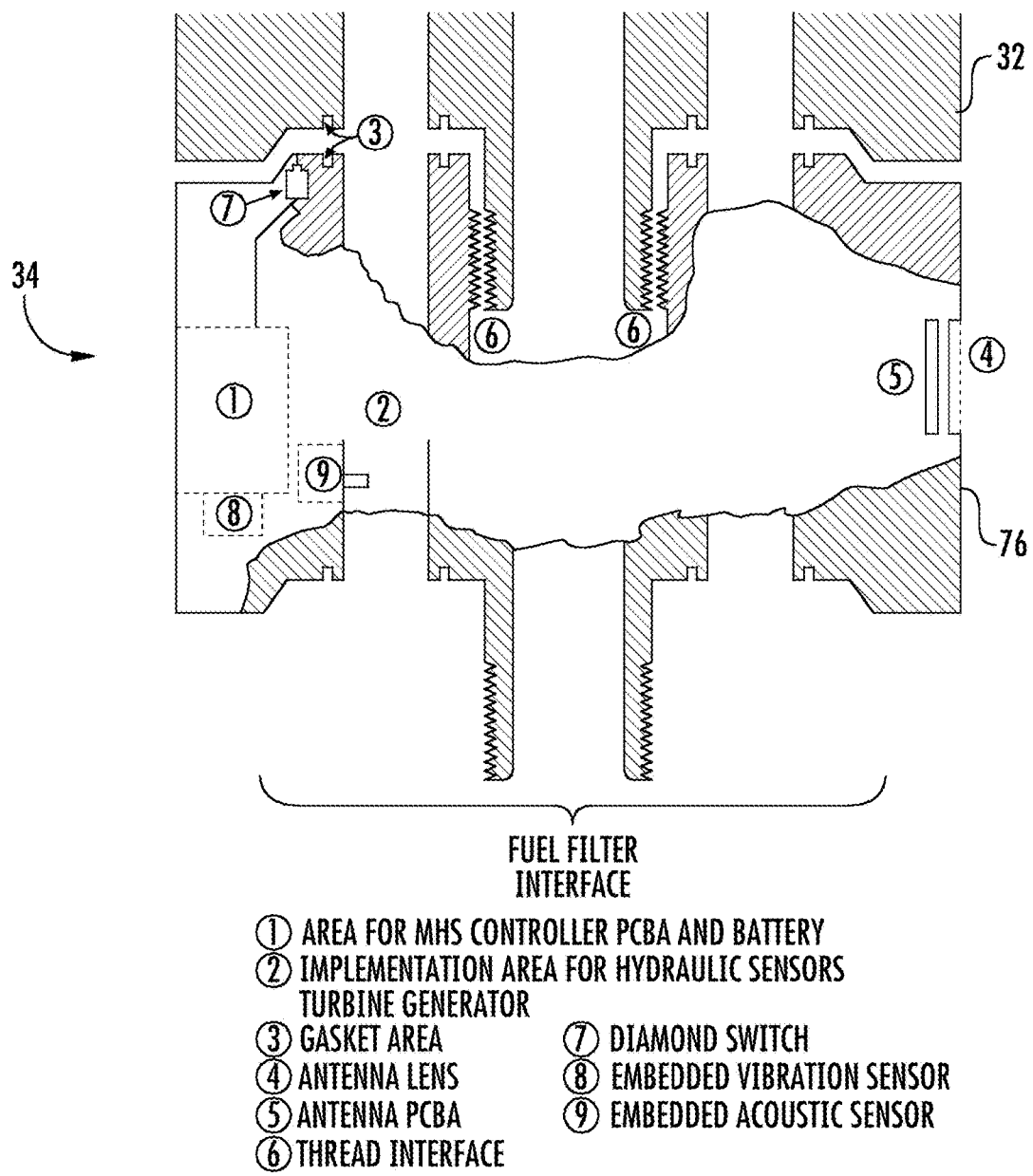
FIG. 5 is a diagrammatic cutaway of a multi-mode hydraulic sensor in accordance with an embodiment of the present invention.
Figure 6:
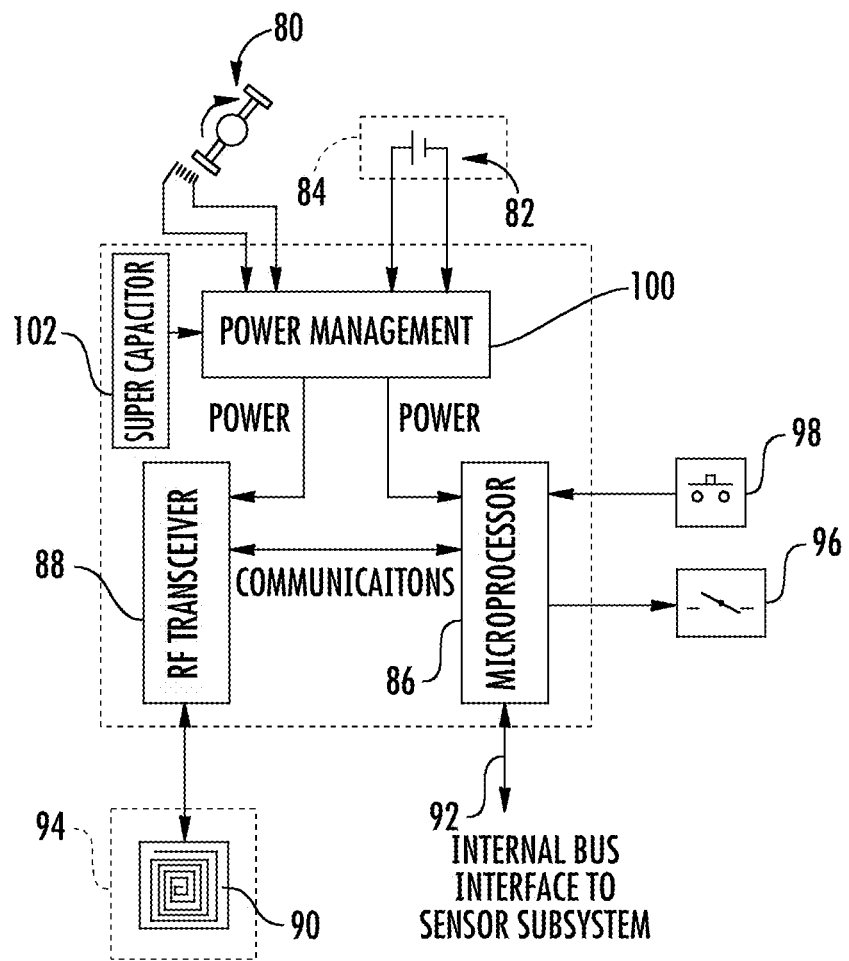
FIG. 6 is a diagrammatic representation showing components of the multi-mode hydraulic sensor of FIG. 5.

Referring now to FIGS. 5 and 6, a preferred embodiment of MHS 34 will be explained in more detail. As noted above, MHS 34 is configured in this case to fit between the filter manifold and fuel filter. As a result, MHS 34 can be easily installed into existing fuel dispensers already deployed, or installed into new dispensers at the time of manufacture. Preferably, MHS 34 is equipped with cryptographic keys for communication with sensor gateway 54 and cloud connection processor 62. The keys can be injected as MHS 34 is put into operation, or when the battery is replaced in the case of embodiments having optional replaceable batteries.

As shown in FIG. 5, MHS 34 includes a body 76 that mounts to a threaded filter mount (post) of manifold 32. Similarly, body 76 includes its own filter mount to which filter 30 is attached. The interfaces between MHS 34 and manifold 32, and between MHS 34 and filter 30, replicate the manifold-filter interface. Flow paths are defined in body

76 for flow of fuel to and from the filter. Various portions of MHS 34 are labeled in FIG. 5 as follows: (1) area for MHS controller circuit board and battery; (2) implementation area for hydraulic sensors and turbine generator; (3) gasket area; (4) antenna lens; (5) antenna circuit board; (6) threaded interface to manifold; (7) dismount switch; (8) embedded vibration sensor; and (9) embedded acoustic sensor. When MHS 34 is fitted to the filter manifold, a locking chemical is preferably utilized to secure it once seated, in order to make removal extremely difficult.

Figure 5A:
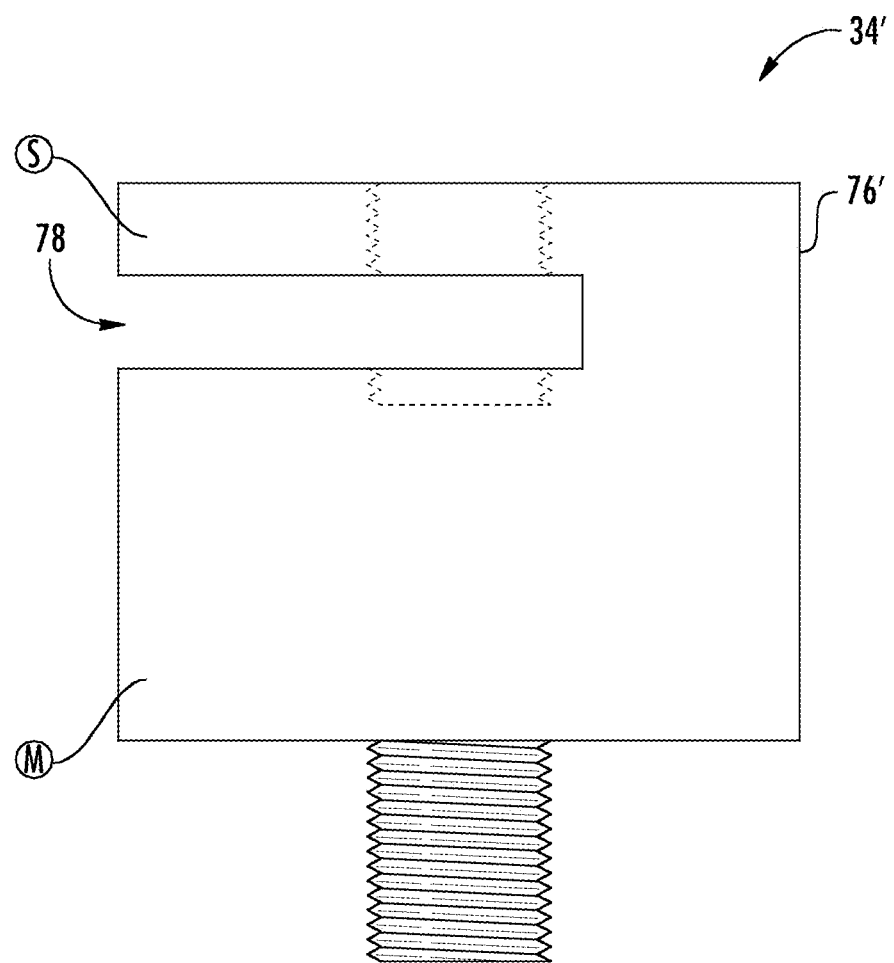
FIG. 5A is a diagrammatic representation of a multi-mode hydraulic sensor body in accordance with another embodiment.

Referring now to FIG. 5A, an alternative MHS 34' having a body 76' is shown. Body 76' is configured to receive a strainer which is intended to catch large debris (with the filter catching smaller debris). The body 34' has a main portion (labeled "M") in which a plurality of sensors as described above in relation to FIG. 5 may be located. A strainer fits in the area designated 78. A secondary portion (labeled "S") containing a pressure sensor defines a threaded bore that is attached to the manifold. In particular, when the filter is screwed on, it extends through the secondary portion, through the strainer, and into the main portion. The metal flexes, clamping down to make a seal on the strainer and compress to prevent leaks. This allows a pressure of fluid to be read pre-strainer/pre-filter, and post strainer/post filter to give a full picture of pressure drop through the device.

FIG. 6 shows a common equipment subsystem contained in MHS 34. As can be seen, this subsystem may include a turbine power generator 80 that creates energy during fuel flow. In this embodiment, a replaceable backup battery 82 is situated within an intrinsically safe compartment 84 defined in body 76, for housekeeping processing when fuel is not flowing. As shown, MHS 34 further includes an industrial internet of things (IIoT) microprocessor 86 and communications interface for sensor interfacing, housekeeping processing, and cryptographic communications to the cloud connection processor. The communications interface utilizes an RF transceiver 88 and built-in antenna 90, or alternatively, a wired interface 92. In embodiments where antenna 90 is utilized, a lens 94 transparent to the frequencies of antenna 90 is preferably located on body 76. Antenna 90 may take the form of an inductive loop that radiates primarily a magnetic field, or a monopole/dipole antenna which primarily radiates an electric field. A wired interface can be an intrinsically safe channel with energy limiting components, or passed through a conduit which meets the applicable safety rules, or passed through an encapsulated interface. MHS 34 also preferably includes a fuel flow stop valve 96 that is actuated as described herein for fraud prevention. A dismount switch 98 detects when removal of the MHS from the filter manifold is attempted.

As noted above, turbine power generator 80 spins when fuel is flowing to generate energy at a level that preferably corresponds to the maximum power load required for operation of MHS 34. In this regard, flowing fuel rotates a magnet relative to a stationary coil to generate a current flow. This current can be harvested by a rectifier circuit (part of power management circuitry 100) located on the MHS controller circuit board.

The rectifier charges a capacitor 102 (e.g., a supercapacitor) to a voltage level related to the speed of rotation. The energy in the capacitor 102 could be used to charge the battery used for memory backup, and for system operation. In particular, the capacitor 102 may be employed for one or more of the following functions: (1) To extend battery life by providing start up energy for the time period when fuel begins to flow, before the turbine is up to speed, (2) Supply energy to operate the fuel flow stop valve, and (3) Supply energy to provide for sensor operation during battery replacement of in lieu of a battery in some embodiments.

Dismount switch 98 is located outside the gasket sealing area (as shown in FIG. 5) and is closed once MHS 34 is seated. Closing the switch sets an anti-fraud switch flag in the software. If this flag is ever reset via removal of the MHS (thereby opening the switch), a major alarm is generated and transmitted to the gateway.

Figure 7:
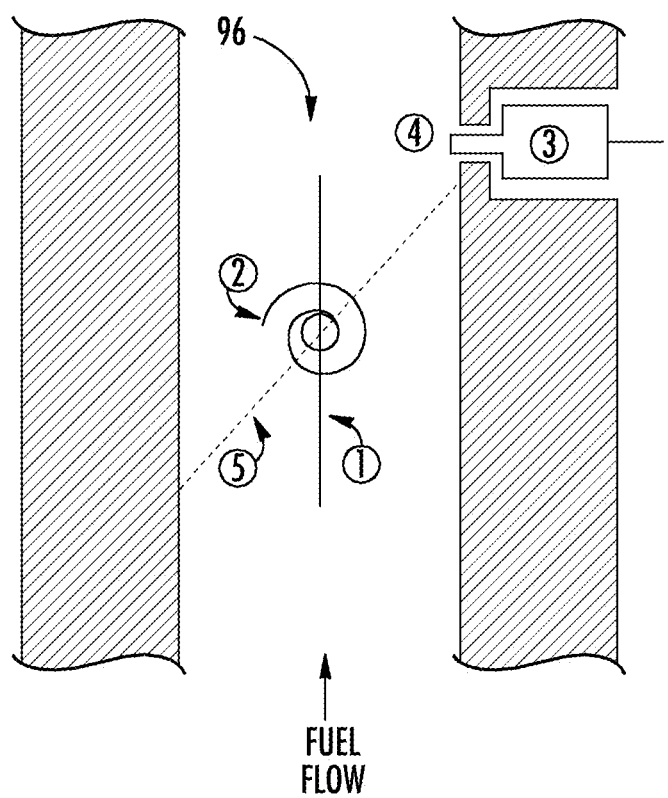
FIG. 7 is a diagrammatic cutaway showing an exemplary fuel flow stop valve that may be used in the multi-mode hydraulic sensor of FIG. 5.

FIG. 7 shows an exemplary embodiment of fuel flow stop valve 96 in greater detail. Various components of valve 96 are labeled in the drawing as follows: (1) butterfly valve (open); (2) spring; (3) low-power solenoid; (4) plunger moved by the solenoid to lock the valve closed; and (5) butterfly valve (open). Various anti-fraud events can cause the fuel flow stop valve 96 to close. These can include fuel flowing when not authorized by the pump controller, sensing of unauthorized opening of the hydraulic cabinet doors, etc. Furthermore, other sensed conditions can also close this valve, such as excessive debris in the fuel sensed by the ionic sensor (described below).

Preferably, software algorithms may be provided to recognize anomalies that would give false indications of flow issues. For instance, nozzle snaps can cause a tremendous, instant rise and drop of pressure throughout a system (on a dispenser level or site level) as a nozzle is snapped on one dispenser and causes a hydraulic hammer type effect throughout the system. Algorithms can be provided to smooth out these and other false positives of rises and drops in hydraulic performance.

Figure 8:
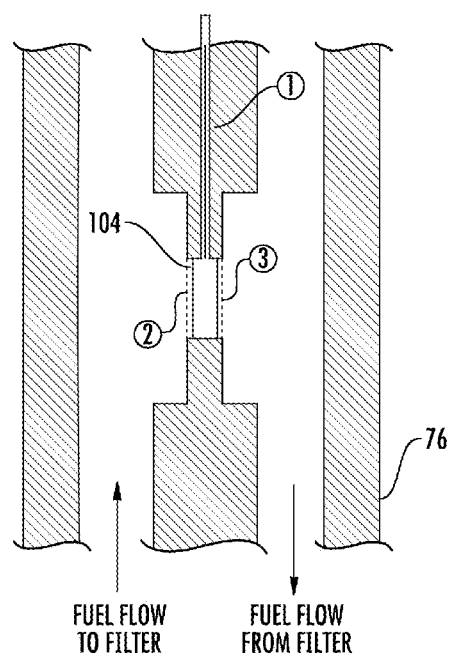
FIG. 8 is a diagrammatic cutaway showing an exemplary differential pressure sensor that may be used in the multi-mode hydraulic sensor of FIG. 5.

MHS 34 preferably includes a suitable pressure sensing arrangement that can detect differential pressure across the filter. Referring now to FIG. 8, exemplary embodiments utilize a differential pressure sensor 104 inside of body 76. In this case, for example, sensor 104 comprises an IC-based micro-electromechanical system (MEMS) differential pressure sensor that is not exposed to the atmosphere. Rather, sensor 104 is positioned between two cavities within the MHS, where one cavity is in fluid communication with the fuel filter inlet, and the other in fluid communication with the outlet. In this way the sensor is sensing differential pressure across the fuel filter. Such differential pressure sensing allows detection of one or more of the following: (1) Filter clogs (DC signal component), (2) Installation of "cheater filter" (no filtration) or ruptured filter (DC signal component), and/or (3) Internal meter or valve leaks (AC signal component).

Figure 9:
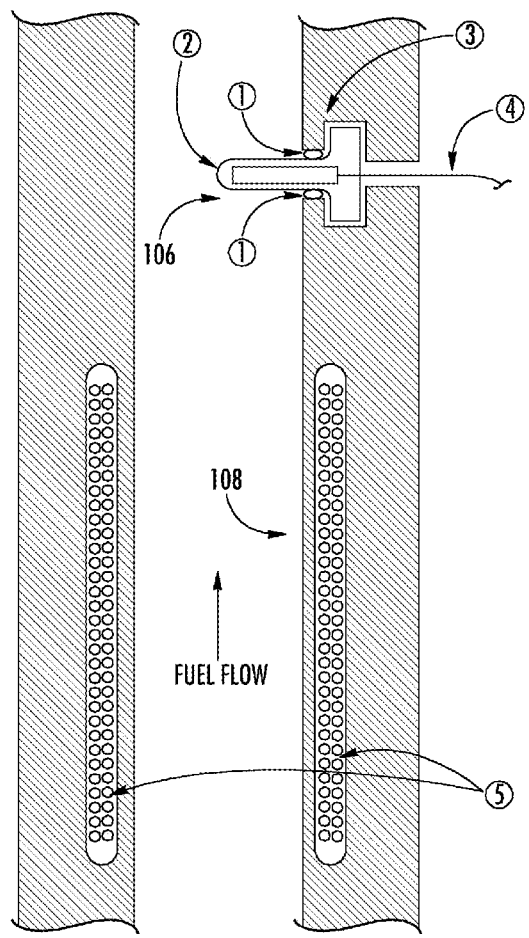
FIG. 9 is a diagrammatic cutaway showing exemplary ionic and temperature sensors that may be used in the multi-mode hydraulic sensor of FIG. 5.

A diagrammatic representation of exemplary fuel temperature sensor 106 and ionic sensor 108 is provided in FIG. 9. As shown, temperature sensor 106 is located within the fuel filter outlet cavity to enable real time measurement of fuel temperature for use in automatic temperature compensation (ATC) systems or for other fuel temperature measurement requirements. The sensing element of the ATC probe may be encased in a relatively thin protective housing, such as steel that allows sensing of the fuel temperature with high accuracy. The probe preferably comprises a platinum-based resistance temperature detector (RTD) for highest long term stability, but other suitable sensors can be used. Associated with the ATC is a test well for the authorities to verify the accuracy of the temperature reading system.

Fuel temperature can be used for determining fraud and flow direction of a dispensing system. Fuel at rest will have a normalized temperature rise or drop based on ambient temperature of the device (internal to the dispenser) or ambient temperature on site. Fuel at rest will have a normalized rise in temperature at rest (and the same applies for temperature drop). Moving fluid has a more erratic nature of temperature measurement based on the heating and cooling of the fluid as it moves through the system and mixes and interacts with metal and fluid of differing temperatures. Utilizing an algorithm, gradual rise or drop based on current conditions (both internal and external to the dispenser) can be easily measured to determine what is a "gradual rise or drop" versus erratic rise or drop. This can provide flow and fraud detection potentially without the need for some of the other sensors discussed herein. Temperature in the static state (not flowing) should have a common prediction of heating and cooling where fluid that is flowing will have a fairly variable measurement in temperature due to the turbulent nature of flow.

In this embodiment, ionic sensor 108 utilizes a coil pickup around a "pipe" that is internal to the MHS, to sense debris in the fuel filter inlet flow. Ionic level threshold detection can be utilized for setting notification and alarm points for fuel quality.

As shown in FIG. 5, MHS 34 preferably also includes embedded vibration and acoustic sensors. Preferably, the vibration sensor comprises an acoustic pickup that is directly mounted to the body of the MHS. The acoustic sensor is mounted such that the "microphone" part of the sensor is submerged in the fuel filter inlet cavity. The outputs of the vibration sensor and of the fuel acoustic sensor may be correlated to enable detection of one or more of the following issues: (1) Meter bearing wear or failure, (2) Valve bearing wear or failure, (3) Valve actuator wear or failure, or of associated control signaling faults, (4) Motor mount wear or failure, (5) Motor bearing wear or failure, (6) STP flow problems, (7) Cabinet door removal, and/or (8) STP flow problems. Additional information regarding suitable acoustic and vibration sensors, and their operation, can be discerned from U.S. Pat. Pub. No. 2015/0346163, incorporated herein by reference in its entirety for all purposes.

It can thus be seen that embodiments of the present invention provide novel systems and methods for monitoring the health and/or status of one or more components in a fuel dispensing environment. Notably, embodiments of the present invention may provide advance notice of potential security breaches, component wear or damage, and other operational issues with components in a fuel dispensing environment. Further, embodiments of the present invention provide "behavioral" analysis of a fuel dispenser or fuel dispensing environment, including internal events, customer-originated events, and potential fraud attacks.

While one or more preferred embodiments of the invention have been described above, it should be understood that any and all equivalent realizations of the present invention are included within the scope and spirit thereof. The embodiments depicted are presented by way of example only and are not intended as limitations upon the present invention. Thus, it should be understood by those of ordinary skill in this art that the present invention is not limited to these embodiments since modifications can be made. Therefore, it is contemplated that any and all such embodiments are included in the present invention as may fall within the scope and spirit thereof.

What is claimed is:

1. A fuel dispenser comprising:
   fuel flow piping defining a flow path from a source of fuel toward a fueling nozzle, said fuel flow piping having a filter manifold for mounting a fuel filter thereon, wherein the filter manifold comprises an inlet filter flow passage and an outlet filter flow passage;
   a plurality of fuel handling components disposed along said fuel flow piping;
   a sensor device mounted between said filter manifold and the fuel filter such that an inlet sensor flow passage is in fluid communication with the inlet filter flow passage and an outlet sensor flow passage is in fluid communication with the outlet filter flow passage, said sensor device having at least one sensor operative to detect a sensed condition related to said fuel dispenser; and
   said sensor device further comprising electronics to transmit a signal related to the sensed condition.

2. A fuel dispenser as set forth in claim 1, wherein said at least one sensor of said sensor device comprises a plurality of different sensors.

3. A fuel dispenser as set forth in claim 2, wherein said plurality of different sensors includes at least two of a vibration sensor, an acoustic sensor, an ionic sensor, and a temperature sensor.

4. A fuel dispenser as set forth in claim 1, wherein said sensor device has a body defining the inlet sensor flow passage and the outlet sensor flow passage therethrough, said body further defining a threaded hole for attachment to a first filter mount of said manifold.

5. A fuel dispenser as set forth in claim 4, wherein said body includes a second filter mount for attachment of said filter thereto.

6. A fuel dispenser as set forth in claim 1, wherein said electronics to transmit a signal comprises a radio to transmit said signal wirelessly via an associated antenna.

7. A fuel dispenser as set forth in claim 6, wherein said antenna is covered by an antenna lens.

8. A fuel dispenser as set forth in claim 1, wherein said at least one sensor includes one or more pressure sensors operative to detect differential pressure between inflow and outflow of said filter manifold.

9. A fuel dispenser as set forth in claim 8, wherein said one or more pressure sensors comprises a micro-electromechanical system (MEMS) differential pressure sensor positioned to be in fluid communication on a first side thereof with a fuel filter inlet and on a second side thereof with a fluid filter outlet.

10. A fuel dispenser as set forth in claim 1, wherein said sensor device comprises a power generator to produce power for its operation.

11. A fuel dispenser as set forth in claim 10, wherein said power generator comprises a turbine power generator that creates electrical energy during fuel flow.

12. A fuel dispenser as set forth in claim 11, wherein said sensor device comprises one or more energy storage components.

13. A fuel dispenser as set forth in claim 12, wherein said one or more energy storage components comprises at least one capacitor.

14. A fuel dispenser as set forth in claim 12, wherein said one or more energy storage components comprises at least one battery.

15. A multi-mode hydraulic sensor device for use in a fuel dispenser, said sensor device comprising:
   a body mountable to a filter manifold disposed along a fuel flow path in the fuel dispenser, wherein the filter manifold defines an inlet filter flow passage and an outlet filter flow passage, and the body is mounted between the filter manifold and a fuel filter such that an inlet sensor flow passage is in fluid communication with the inlet filter flow passage and an outlet sensor flow passage is in fluid communication with the outlet filter flow passage;

a plurality of different sensors operative to detect a sensed condition related to the fuel dispenser; and said sensor device further comprising electronics to transmit a signal related to the sensed condition, said electronics including a radio to transmit said signal wirelessly via an associated antenna.

16. A multi-mode hydraulic sensor device as set forth in claim 15, wherein said plurality of different sensors includes at least two of a vibration sensor, an acoustic sensor, an ionic sensor, and a temperature sensor.

17. A multi-mode hydraulic sensor device as set forth in claim 15, wherein said body defines a threaded hole for attachment to a first filter mount of said fuel dispenser and a second filter mount for attachment of a filter thereto.

18. A multi-mode hydraulic sensor device as set forth in claim 15, wherein said antenna is covered by an antenna lens.

19. A multi-mode hydraulic sensor device as set forth in claim 15, wherein said plurality of different sensors includes one or more pressure sensors operative to detect differential pressure between inflow and outflow of fuel through said body.

20. A multi-mode hydraulic sensor device as set forth in claim 19, wherein said one or more pressure sensors comprises a micro-electromechanical system (MEMS) differential pressure sensor.

21. A multi-mode hydraulic sensor device as set forth in claim 15, wherein said sensor device comprises a power generator to produce power for its operation.

22. A multi-mode hydraulic sensor device as set forth in claim 21, wherein said power generator comprises a turbine power generator that creates electrical energy during fuel flow.

23. A multi-mode hydraulic sensor device as set forth in claim 22, wherein said sensor device comprises one or more energy storage components.

24. A multi-mode hydraulic sensor device as set forth in claim 23, wherein said one or more energy storage components comprises at least one capacitor.

25. A multi-mode hydraulic sensor device as set forth in claim 24, wherein said one or more energy storage components comprises at least one battery.

* * * * *